United States Patent [19]
Sigmon et al.

[11] Patent Number: 5,739,723
[45] Date of Patent: Apr. 14, 1998

[54] LINEAR POWER AMPLIFIER USING ACTIVE BIAS FOR HIGH EFFICIENCY AND METHOD THEREOF

[75] Inventors: Bernard Eugene Sigmon; Robert Michael Jackson, both of Gilbert, Ariz.

[73] Assignee: Motorola, Inc., Schaumburg, Ill.

[21] Appl. No.: 566,811

[22] Filed: Dec. 4, 1995

[51] Int. Cl.$^6$ .................................................. H03F 3/68
[52] U.S. Cl. .................................... 330/295; 330/296
[58] Field of Search .............................. 330/124 R, 127, 330/286, 295, 296; 455/127

[56] References Cited

U.S. PATENT DOCUMENTS

| | | | |
|---|---|---|---|
| 5,420,541 | 5/1995 | Upton et al. | 330/286 |
| 5,541,554 | 7/1996 | Stengel et al. | 330/295 X |

OTHER PUBLICATIONS

"Improving The Power–Added Efficiency of FET Amplifiers Operating With Varying–Envelope Signals" by Adel A.M. Saleh and Donald C. Cox from 1983 IEEE.

*Primary Examiner*—Steven Mottola
*Attorney, Agent, or Firm*—Kevin Johanson; Sherry Whitney

[57] ABSTRACT

A Doherty-type active bias power amplifier (90) suitable for satellite telecommunication systems provides linear amplification of noise-like RF input signals (100) that have multiple carriers spread over a large instantaneous bandwidth. As RF input signal (100) to active bias power amplifier (90) increases, the negative pinch-off voltage that normally causes development of a negative voltage on the gate/base is precluded from occurring in the carrier amplifier (115) and thus an improvement in RF output power is achieved as well as an increase in the dynamic RF input drive range over which high efficiency operation can be achieved. Active biasing provides the proper bias-on point for the peaking amplifier (135) in order to achieve maximum RF efficiency operation.

17 Claims, 1 Drawing Sheet

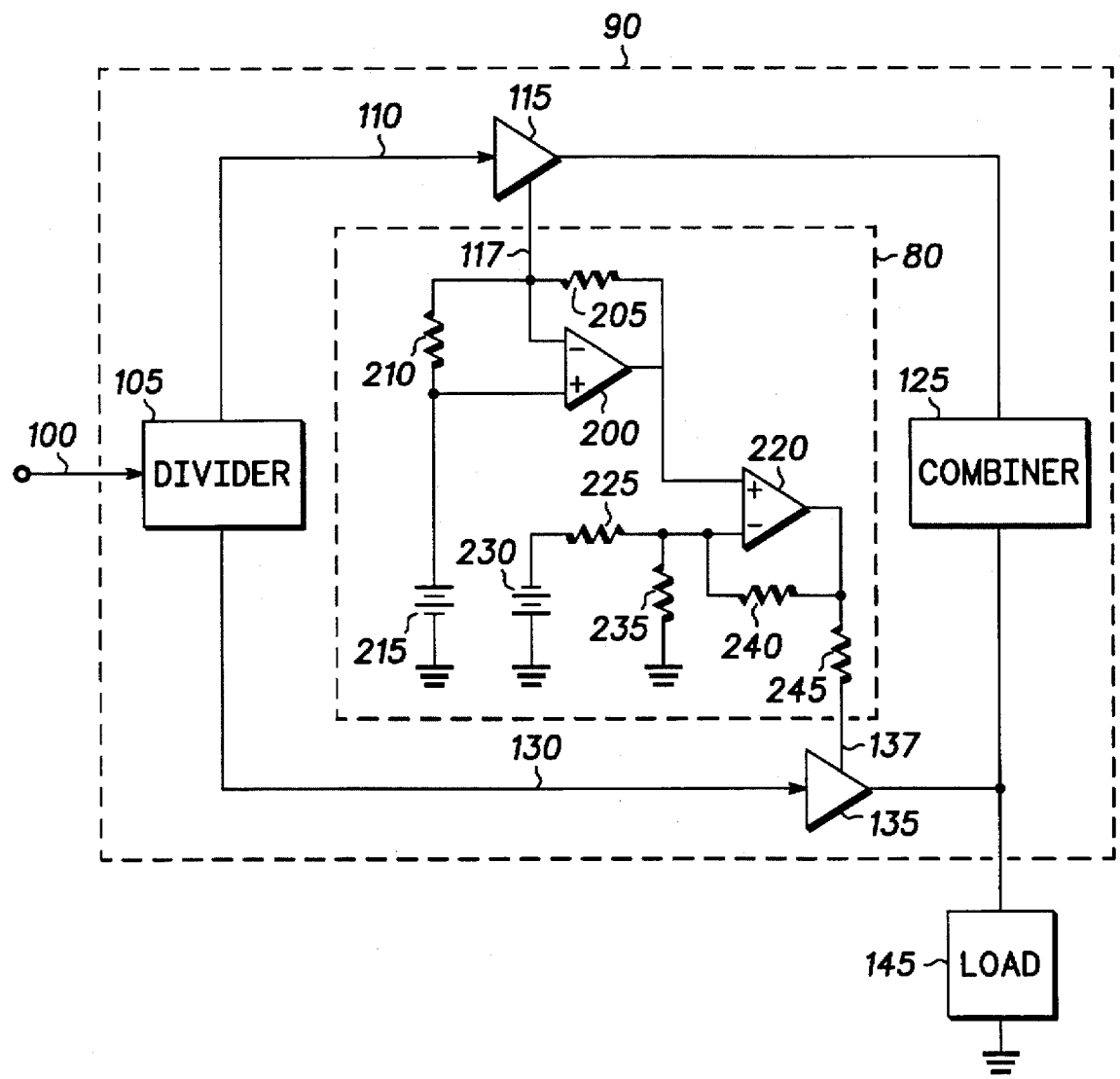

LINEAR POWER AMPLIFIER USING ACTIVE BIAS FOR HIGH EFFICIENCY AND METHOD THEREOF

FIELD OF THE INVENTION

This invention relates in general to linear power amplifiers, and more particularly to microwave power amplifiers employing active biasing.

BACKGROUND OF THE INVENTION

It is desirable for RF power amplifiers to linearly amplify RF signals in a highly efficient manner. However, there are tradeoffs between maximum efficiency and high linearity. Efficiency is generally proportional to input drive level, and high efficiency is usually not attained until an amplifier approaches its maximum output power, which is not consistent with linear operation. Doherty-type amplifiers, for example, achieve an efficiency advantage over standard class AB and class B amplifiers near peak power, in part, because of an instantaneous modulation of their carrier amplifier's loadline as the RF input level changes. In other words, Doherty-type amplifiers exhibit a more benign relationship between input drive level and efficiency because the amplifier's loadline is continuously modified to maintain high efficiency as input drive level changes. In addition, the bias power of Doherty-type amplifiers is greatly reduced over standard class AB and class B amplifiers.

High linearity is generally evidenced by a low level of non-linear intermodulation products. In many situations, the RF signals that need to be amplified in satellite telecommunication systems include multiple carrier frequencies spread over a large instantaneous bandwidth. The noise-like characteristics of these multiple-carrier signals make it difficult to amplify such signals in a linear fashion.

In amplifier design, as input RF drive levels increase, RF output drive levels also increase until the amplifier approaches saturation. However, if the RF drive level is sufficiently large in level, the carrier amplifier will develop a negative voltage on its gate/base (due to rectification of the RF signal as a result of the gate-source junction being driven into forward bias). If this negative voltage occurs prior to the active devices achieving their full output power capability then the carrier amplifier will be "pinched off" and RF power saturation will occur early.

Thus what is needed is a bias circuit for a Doherty-type amplifier that precludes the negative "pinch-off" voltage from occurring in the peaking amplifier allowing an improvement in RF output power to be achieved as well as an increase in the dynamic RF input drive range over which high efficiency operation can be achieved.

BRIEF DESCRIPTION OF THE DRAWING

The invention pointed out with particularity in the appended claims. However, a more complete understanding of he present invention may be derived by referring to the detailed description and claims when considered in connection with the figure.

FIG. 1 shows a block diagram of a Doherty-type power amplifier with active bias in accordance with the present invention.

The exemplification set out herein illustrates a preferred embodiment of the invention in one form thereof, and such exemplification is not intended to be construed as limiting in any manner.

DETAILED DESCRIPTION OF THE DRAWING

The present invention provides, among other things, a power amplifier that linearly amplifies using an active bias circuit for high efficiency by providing a means to electrically determine the RF drive level for an active device, such as a field effect transistor (FET), or a bipolar transistor. Knowing the RF drive level offers a means by which electrical circuitry may be employed to improve on the DC to RF conversion efficiency of power amplifiers and/or determine the RF envelop of composite input signals.

The present invention employs solid-state physics of FETs and/or bipolar transistors in that the gate/source junction and the base/emitter junctions of the respective devices form PN junctions which under reverse bias conditions exhibit a leakage current given by the equation:

$$I_{(diode)} = I_s \{ e^{qV/(nKT)} - 1 \}$$

where:

$I_{(diode)}$ = the current in the PN junction of the device's gate source region (i.e., for a FET), V = the reverse bias voltage applied to the gate/base junction, q = electronic charge ($1.602 \times 10^{-19}$), T = temperature in degrees Kelvin (25° C. = 298° K.), n = ideality factor to account for space charge recombination in the diode junction, K = Boltzmann constant ($1.380 \times 10^{-23}$ joule/°K), and $I_s$ = reverse saturation current of the diode junction.

Under RF drive conditions, the above equation becomes:

$$I_{(diode)} = I_s \{ e^{qV_g Sin(\omega t)/(nKT)} - 1 \}$$

where:

$V_g Sin(\omega t)$ = the time varying RF drive voltage about the gate voltage.

Integration of this equation over one time period yields the average gate voltage for that period.

If a resistor was placed in series with the DC gate voltage or DC base voltage of an FET or bipolar device, a DC voltage at the gate/base and current through the resistor that is a function of applied RF drive level can be measured.

This RF drive induced voltage and current may then be employed in control circuitry whose function is to determine optimum biasing conditions for achieving maximum RF output power and DC to RF conversion efficiency for the RF power amplifier in which the device from which this control voltage and current is obtained is being used.

An increasing RF input signal would result in increased RF output power until the amplifier approaches saturation. However, if the RF drive level is sufficiently large in level, the carrier amplifier will develop a negative voltage on its gate/base (due to rectification of the RF signal as a result of the gate/source junction being driven into forward bias). If this negative voltage occurs prior to the active devices achieving their full RF output power capability, then the carrier amplifier will be "pinched-off" and RF power saturation will occur early.

In this invention, the negative "pinch-off" voltage is precluded from occurring in the peaking amplifier and thus an improvement in RF output power is achieved as well as an increase in the dynamic RF input drive range over which high efficiency operation can be achieved.

FIG. 1 shows a block diagram of a Doherty-type power amplifier with active bias in accordance with the present invention. Active bias power amplifier 90 receives an RF input signal 100 comprising a modulated multi-carrier signal such as voice data, paging data or other modulated data to be transmitted in a communications system. A power divider 105 splits RF input signal 100 into a first signal denoted as inphase signal 110 and a separate second signal. Power divider 105 implements a 90 degree phase shift on the separate second signal to for a quadrature phase signal 130. Power divider 105 may be implemented as a transmission line employing microstrip using configurations known in the art such as Wilkenson power dividers or Lange couplers. Due to splitting, inphase signal 110 and quadrature phase signal 130 are 3dB less in magnitude than RF input signal 100.

A carrier amplifier 115 and peaking amplifier 135 respond to an active bias circuit 80 in determining an activation interim designating an amplifier classification. Carrier amplifier 115 amplifies inphase signal 110 relative to carrier amp bias input 117. Carrier amplifier 115 is coupled to power divider 105. Carrier amplifier 115 desirably operates at low input signal power levels. Carrier amplifier 115 is desirably a bi-polar junction transistor, or field effect transistor (FET) and preferably a pseudomorphic high electron mobility transistor (PHEMT). MESFETs, heterostructure field effect transistors (H-FETs), HEMTs, and other three terminal devices may also be used. Carrier amplifier 115 is desirably biased as a class "B" amplifier, or a class "AB" amplifier.

Carrier amp bias input 117, also known as a first reference voltage, couples to carrier amplifier 115 and dictates the conduction cycle and classification of carrier amplifier 115. Carrier amp bias input 117 couples to an opamp 200 having differential inputs, one of which is biased to a bias supply voltage 215, which in the preferred embodiment has a range about –2.1 volts. The other input to opamp 200 senses a change in carrier amp bias input 117 across resistor 210. Opamp 200 generates a second reference voltage output for driving an opamp 220. Resistors 210 and 205 set the gain of opamp 200. A second opamp 220 responds to changes in carrier amp bias input 117 as detected from the swing in the output of opamp 200. Resistors 225 and 235 set the quiescent bias voltage for opamp 220 using bias supply voltage 230, while resistors 240 and 235 set the gain of opamp 220. A resistor 245 is optional in a single stage Doherty-type amplifier as shown, but in a multi-stage Doherty-type amplifier, resistor 245 performs a similar function to resistor 210 by providing a changing gate/base voltage as a function of drive level for biasing a second carrier amplifier of a subsequent stage. A peaking amp bias input 137 dictates the activation time of peaking amplifier 135. Peaking amplifier 135 desirably turns on at higher input signal power levels relative to those at which carrier power amplifier 115 operates. In the preferred embodiment, peaking amplifier 135 is of the same type and substantially identical to carrier amplifier 115. Preferably, peaking amplifier 135 is matched with carrier amplifier 115 and may be fabricated from the same die lot. Desirably, peaking amplifier 135 is biased similar to a class "C" amplifier. Because of this bias condition, peaking amplifier 135 is turned off at low signal levels and its output looks like an open circuit, and it's output impedance is infinite or quite large. Those of ordinary skill in the art understand how to design devices for the amplifiers having the above discussed characteristics.

The output of carrier amplifier 115 couples to a combiner or phase shifter and impedance inverter 125 and phase shifter and impedance inverter 125 shifts the phase of inphase signal 110 as amplified by carrier amplifier 115 to properly align in phase this signal path with that of quadrature phase signal 130 as amplified by peaking amplifier 135. Both signals are then delivered to a load 145 in phase with each other.

Thus a power amplifier has been described that uses device physics to achieve a voltage that is proportional to the input RF drive signal's amplitude. The use of this voltage is then applied in such a manner as to achieve one or more desirable effects such as improved linearity, higher DC to RF conversion efficiency, additional RF output power, and as a means for determining the composite envelope of the RF signals to be amplified. This power amplifier is suitable for use in satellite based telecommunication systems where efficiency is critical because of limited battery and solar power. Further, this power amplifier is suitable for use in cellular telecommunications that use multiple carrier frequencies spread over a large instantaneous bandwidth.

The present invention overcomes specific problems and accomplishes certain advantages relative to prior art methods and mechanisms. For example, it is no longer necessary to employ more complicated circuitry such as sampling and detection of an RF input signal which is then operated on in such a manner as to achieve the desired results.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A power amplifier having an active bias, comprising:
   a power divider coupled to an RF input signal for producing an inphase signal and a quadrature phase signal from said RF input signal;
   a carrier amplifier for amplifying said inphase signal from said power divider;
   a peaking amplifier for amplifying said quadrature phase signal from said power divider;
   a combiner coupled to both an output of said carrier amplifier and an output of said peaking amplifier, said combiner for combining in additive phase said output of said carrier amplifier and said output of said peaking amplifier; and
   an active bias circuit coupled to both of said carrier amplifier and said peaking amplifier, said active bias circuit for determining optimum biasing conditions as said RF input signal varies in magnitude and for achieving maximum RF output power and conversion efficiency of said carrier amplifier and said peaking amplifier, said active bias circuit comprising means for sensing a change in a carrier amplifier bias input, means for generating a reference voltage based on said carrier amplifier bias input, and means for generating a peaking amplifier bias input based on said reference voltage.

2. A power amplifier as recited in claim 1, wherein said carrier amplifier is biased to provide amplification of said RF input signal at low power levels, and wherein said peaking amplifier is biased to commence amplification when said RF input signal is at a higher power level.

3. A power amplifier having an active bias, comprising:
   a power divider coupled to an RF input signal for producing an inphase signal and a quadrature phase signal from said RF input signal;

a carrier amplifier for amplifying said inphase signal from said power divider, wherein said carrier amplifier is biased to provide amplification of said RF input signal at low power levels;

a peaking amplifier for amplifying said quadrature phase signal from said power divider, wherein said peaking amplifier is biased to commence amplification when said RF input signal is at a higher power level than the low power levels;

a combiner coupled to both an output of said carrier amplifier and an output of said peaking amplifier, said combiner for combining in additive phase said output of said carrier amplifier and said output of said peaking amplifier; and an active bias circuit coupled to both of said carrier amplifier and said peaking amplifier, said active bias circuit for determining optimum biasing conditions as said RF input signal varies in magnitude and for achieving maximum RF output power and conversion efficiency of said carrier amplifier and said peaking amplifier, wherein said active bias circuit comprises a first opamp and a second opamp.

the first opamp for sensing a change in a carrier amplifier bias input of said carrier amplifier as a result of a variation in said RF input signal, said first opamp also comparing said carrier amplifier bias input with a first bias supply voltage and generating a reference voltage, and the second opamp for secondly comparing said reference voltage from said first opamp with a second bias supply voltage and generating a peaking amplifier bias input for controlling said peaking amplifier.

4. A power amplifier as recited in claim 3, wherein as said RF input signal varies, said peaking amplifier bias input also varies a commencement of amplification of said peaking amplifier.

5. A power amplifier having an active bias, comprising:

a power divider coupled to an RF input signal for producing an inphase signal and a quadrature phase signal from said RF input signal;

a carrier amplifier for amplifying said inphase signal from said power divider, wherein said carrier amplifier is biased to provide amplification of said RF input signal at low power levels;

a peaking amplifier for amplifying said quadrature phase signal from said power divider, wherein said peaking amplifier is biased to commence amplification when said RF input signal is at a higher power level than the low power levels;

a combiner coupled to both an output of said carrier amplifier and an output of said peaking amplifier, said combiner for combining in additive phase said output of said carrier amplifier and said output of said peaking amplifier; and an active bias circuit coupled to both of said carrier amplifier and said peaking amplifiers, said active bias circuit for determining optimum biasing conditions as said RF input signal varies in magnitude and for achieving maximum RF output power and conversion efficiency of said carrier amplifier and said peaking amplifier, wherein said active bias circuit comprises a means for sensing, a means for firstly comparing, a means for secondly comparing, and a means for varying commencement of amplification of said peaking amplifier, wherein the means for sensing senses a start of saturation and pinch-off of said carrier amplifier as a result of a negative charge build-up resulting from an increase in said RF input signal, the means for firstly comparing compares said negative charge build-up with a first bias supply voltage to generate a reference voltage, and the means for secondly comparing compares said reference voltage with a second bias supply voltage to generate a peaking amp bias input.

6. A power amplifier as recited in claim 2, wherein said RF input signal is a multi-carrier signal.

7. A power amplifier as recited in claim 2, wherein said carrier amplifier and said peaking amplifier comprise heterojunction field effect transistors.

8. A power amplifier as recited in claim 2, wherein said carrier amplifier and said peaking amplifier comprise bipolar transistors.

9. A power amplifier as recited in claim 2, wherein said carrier amplifier and said peaking amplifier comprise gallium arsenide semiconductor devices.

10. A method for amplifying an RF input signal using a power amplifier including active bias for improving efficiency as said RF input signal varies in signal level, said method comprising the steps of:

dividing said RF input signal into an inphase signal and a quadrature phase signal;

firstly amplifying said inphase signal using a carrier amplifier to produce a first amplified signal;

varying a carrier amplifier bias input relative to said RF input signal;

biasing a peaking amplifier using a peaking amp bias input relative to said carrier amplifier bias input wherein the peaking amp bias input is generated based on a reference voltage which is related to a start of saturation and pinch-off of said carrier amplifier;

when said quadrature phase signal overcomes said peaking amp bias input, secondly amplifying said quadrature phase signal to produce a second amplified signal; and combining in phase said first amplified signal with second amplified signal to produce an output signal.

11. A method for amplifying an RF input signal using a power amplifier including active bias for improving efficiency as said RF input signal varies in signal level, said method comprising the steps of:

dividing said RF input signal into an inphase signal and a quadrature phase signal;

firstly amplifying said inphase signal using a carrier amplifier to produce a first amplified signal;

varying a carrier amplifier bias input relative to said RF input signal;

biasing a peaking amplifier using a peaking amp bias input relative to said carrier amplifier bias input by
  a) sensing a start of saturation and pinch-off of said carrier amplifier as a result of a negative charge build-up resulting from an increase in said RF input signal,
  b) firstly comparing said negative charge build-up with a first bias supply voltage to generate a reference voltage,
  c) for secondly comparing said reference voltage with a second bias supply voltage to generate a peaking amp bias input, and d) varying commencement of amplification of said peaking amplifier relative to said peaking amp bias input;

when said quadrature phase signal overcomes said peaking amp bias input, secondly amplifying said quadrature phase signal to produce a second amplified signal; and combining in phase said first amplified signal with second amplified signal to produce an output signal.

12. A method as recited in claim 11, wherein said dividing step comprises the steps of:

splitting said RF input signal into an inphase signal and a second signal; and phase shifting said second signal into a quadrature phase signal.

13. A method as recited in claim 11, wherein said combining step comprises the steps of:

phase shifting said first amplified signal to form a phase shifted first amplified signal; and combining said phase shifted first amplified signal with said second amplified signal to form an output signal.

14. A method as recited in claim 11, wherein said RF input signal is a multi-carrier signal.

15. A method as recited in claim 11, wherein said carrier amplifier and said peaking amplifier are heterojunction field effect transistors.

16. A method as recited in claim 11, wherein said carrier amplifier and said peaking amplifier are bipolar transistors.

17. A method as recited in claim 11, wherein said carrier amplifier and said peaking amplifier comprise a gallium arsinide semiconductor devices.

* * * * *